United States Patent
Cheong

(10) Patent No.: US 6,465,301 B1
(45) Date of Patent: Oct. 15, 2002

(54) METHOD FOR FABRICATING CAPACITOR OF SEMICONDUCTOR DEVICE

(75) Inventor: Yeon Woo Cheong, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/996,615

(22) Filed: Nov. 30, 2001

(30) Foreign Application Priority Data

Apr. 30, 2001 (KR) ........................................ 2001-23397

(51) Int. Cl.⁷ .......................................... H01L 21/8242
(52) U.S. Cl. ...................... 438/255; 438/253; 438/396; 438/964
(58) Field of Search ................................ 438/255, 253, 438/254, 396–398, 964, 390–395, 256; 257/296, 306, 68, 71

(56) References Cited

U.S. PATENT DOCUMENTS 5,597,756 A    1/1997  Fazan et al.
5,913,119 A  *  6/1999  Lin et al. ..................... 438/396
5,960,281 A    9/1999  Nam et al.
5,963,805 A  * 10/1999  Kang et al. .................. 438/255

FOREIGN PATENT DOCUMENTS

JP          2000-216346    *  4/2000    ........... H01L/27/04

* cited by examiner

Primary Examiner—Olik Chaudhuri
Assistant Examiner—Yennhu B. Huynh
(74) Attorney, Agent, or Firm—Birch, Stewart, Kolasch & Birch, LLP

(57) ABSTRACT

A method for fabricating a capacitor of a semiconductor device, includes providing a semiconductor substrate, forming a polysilicon layer pattern on the semiconductor substrate, forming a first HSG structure on an inner surface of the polysilicon layer pattern, forming a second HSG structure on the first HSG structure and an outer surface of the polysilicon layer pattern to produce a lower electrode of the capacitor, forming a dielectric film on the second HSG structure, and forming an upper electrode on the dielectric film.

20 Claims, 7 Drawing Sheets

METHOD FOR FABRICATING CAPACITOR OF SEMICONDUCTOR DEVICE

RELATION APPLICATION

The present application claims the benefit of Korean Patent Application No. 2001-23397 filed Apr. 30, 2001, which is herein fully incorporated by reference.

BACKGROUND OF THE INVENTION

1. Field of the Invention

The present invention relates to a semiconductor memory device, and in particular to a method for fabricating a capacitor of a semiconductor device, which can easily adjust a capacitance of the capacitor, and which can solve a bridge problem between the capacitors.

2. Description of the Background Art

In general, memory products have been highly integrated due to development of miniaturized semiconductor technologies. Due to this development, an area size of a unit cell and an operation voltage level are remarkably reduced.

In spite of the decreased cell area, a capacitance over 25fF/cell is required to prevent generation of a soft error and reduction of refresh time.

As in a conventional nitride/oxide (NO) film structure, a DRAM capacitor using a nitride film as a dielectric substance forms a lower electrode in a three-dimensional shape or increases a height of the lower electrode in order to increase an effective area and obtain a sufficient capacitance.

However, a process for forming the lower electrode in a three-dimensional shape is complicated, and thus it is difficult to obtain a sufficient capacitance in the conventional DRAM capacitor.

On the other hand, in a process for increasing a height of the lower electrode, a depth of focus is not obtained in a succeeding exposure process due to a stepped portion between a cell region and a peripheral circuit region which is generated by the increased height of the lower electrode. This problem affects the operation of the capacitor In order to solve the foregoing problems, there has been suggested a method for forming an uneven hemi-spherical grain (HSG) structure on the surface of the lower electrode. However, the HSG structure generates a bridge problem between the lower electrodes, which results in reduced reliability of the device.

A conventional method for fabricating a capacitor of a semiconductor device will now be described in detail with reference to FIGS. 1 to 7.

FIGS. 1 through 5 are cross-sectional diagrams illustrating sequential steps of the conventional method for fabricating the capacitor of the semiconductor device. FIGS. 6 and 7 show generation of a bridge between lower electrodes, in the conventional method for fabricating the capacitor of the semiconductor device.

As illustrated in FIG. 1, an interlayer insulating film 3 is deposited on a semiconductor substrate 1, and a photoresist film pattern (not shown) exposing a presumed lower electrode contact region is formed on the interlayer insulating film 3.

The interlayer insulating film 3 is selectively removed by using the photoresist film pattern as a mask, to partially expose the semiconductor substrate 1.

Thereafter, the photoresist film pattern is removed, and a polysilicon layer is deposited on the interlayer insulating film 3 including the exposed portions of the semiconductor substrate 1. The polysilicon layer is etched to remain merely in the exposed portions of the semiconductor substrate 1, thereby forming a contact plug 5 as a lower electrode contact.

A nitride film 7 as an etch barrier film is formed over the resultant structure, and an oxide film 9 is deposited on the nitride film 7.

Referring to FIG. 2, a photoresist film (not shown) is coated on the oxide film 9, and selectively patterned according to exposure and development processes of a photolithography process, thus forming a photoresist film pattern 11 for a lower electrode pattern for forming a capacitor.

The oxide film 9 and the nitride film 7 are selectively removed by employing the photoresist film pattern 11 as a mask, to form contact holes 12 partially exposing the interlayer insulating film 3 including the contact plug 5.

As depicted in FIG. 3, the photoresist film pattern 11 is removed, a polysilicon layer 13 and an SOG film 15 are sequentially deposited over the resultant structure including the contact holes 12, and the SOG film 15 is selectively removed according to an etch back process.

As illustrated in FIG. 4, the polysilicon layer 13 is selectively removed by using the residual SOG film 15a as a mask, until the top surface of the oxide film 9 is exposed. As a result, a polysilicon layer pattern 13a is formed.

As shown in FIG. 5, the residual SOG film 15a and the oxide film 9 are removed. When the oxide film 9 is completely removed, an uneven HSG structure 17 is formed on the polysilicon layer pattern 13a according to an HSG process, thereby forming a profile of the lower electrode.

Although not illustrated, a dielectric film (not shown) and an upper electrode (not shown) are sequentially formed on the HSG structure 17, and thus the fabrication of the capacitor of the semiconductor device is finished.

However, in the conventional method for fabricating the capacitor, a big HSG structure is required to increase a capacitance. As the size of the HSG structures increases, bridges are formed between adjacent HSG structures. For example, as shown in FIGS. 6 and 7, a bridge is generated between the adjacent HSG structures in region A due to the lack of a space margin between the lower electrodes, which results in reduced reliability of the device.

Further, poor reliability of the device due to the bridge deteriorates a refresh property and operation of the device.

SUMMARY OF THE INVENTION

Accordingly, it is an object of the present invention to provide a method for fabricating a capacitor of a semiconductor device, which can improve a refresh property and remove a bridge between adjacent capacitors, by easily adjusting a capacitance.

In order to achieve the above-described and other objects of the present invention, there is provided a method for fabricating a capacitor of a semiconductor device according to an embodiment of the present invention, including the steps of: providing a semiconductor substrate; forming a cylinder type lower electrode by forming a polysilicon layer on the semiconductor substrate; forming a first HSG structure on the inside surface of the cylinder type lower electrode; forming a second HSG structure on the surface of the first HSG structure and the outside surface of the cylinder type lower electrode; forming a dielectric film on the second HSG structure; and forming an upper electrode on the dielectric film.

In another aspect of the present invention, a method for fabricating a capacitor of a semiconductor device includes the steps of: providing a semiconductor substrate; forming an insulating film having a contact hole on the semiconductor substrate; forming a polysilicon layer and a first HSG structure on the insulating film having the contact hole; forming a cylinder type lower electrode consisting of the polysilicon layer and the first HSG structure, by selectively patterning the polysilicon layer and the first HSG structure until the top surface of the insulating film is exposed; removing the insulating film, and forming a second HSG structure on the first HSG structure and the polysilicon layer which compose the cylinder type lower electrode; forming a dielectric film on the second HSG structure; and forming an upper electrode on the dielectric film.

In still another aspect of the present invention, a method for fabricating a capacitor of a semiconductor device includes the steps of: providing a semiconductor substrate; forming a first interlayer insulating film on the semiconductor substrate; forming a first contact hole by selectively patterning the first interlayer insulating film; forming a contact plug in the first contact hole to electrically contact the semiconductor substrate; forming a second interlayer insulating film on the first interlayer insulating film including the contact plug; forming a second contact hole to expose a lower electrode region of the first interlayer insulating film including the contact plug, by selectively patterning the second interlayer insulating film; forming a polysilicon layer on the exposed surface of the second interlayer insulating film including the second contact hole; forming a first HSG structure on the polysilicon layer; forming a sacrificial film on the first HSG structure, and selectively etching back the sacrificial film; selectively removing the exposed portion of the first HSG structure and the polysilicon layer, by using the sacrificial film as a mask; removing the sacrificial film and the second interlayer insulating film; forming a second HSG structure on the first HSG structure and the exposed surface of the polysilicon layer; and sequentially forming a dielectric film and a conductive film over the resultant structure.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for fabricating a capacitor of a semiconductor device in accordance with a preferred embodiment of the present invention will now be described in detail with reference to the accompanying drawings.

FIGS. 8 through 14 are cross-sectional views illustrating process steps of a method for fabricating a capacitor of a semiconductor device in accordance with an embodiment of the present invention.

Figure 1:
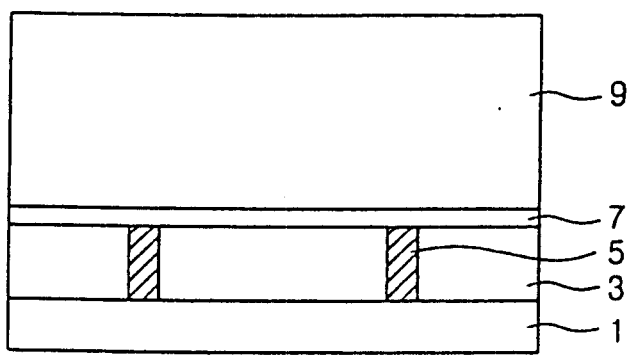
FIGS. 1 through 5 are cross-sectional views illustrating sequential steps of a conventional method for fabricating a capacitor of a semiconductor device.
Figure 2:
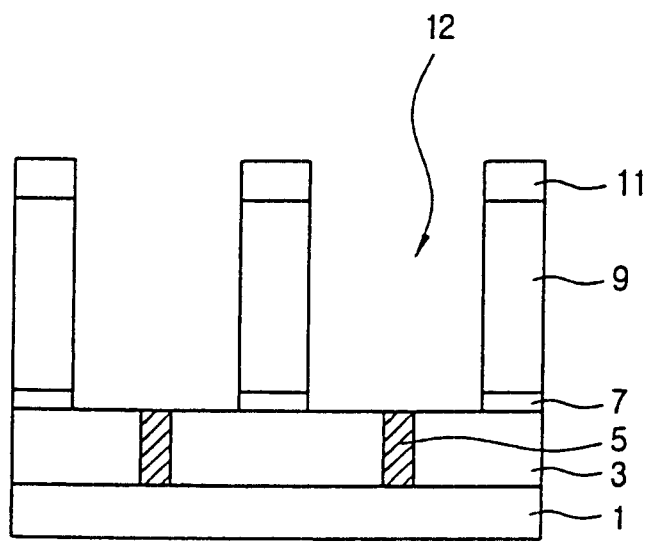
Figure 3:
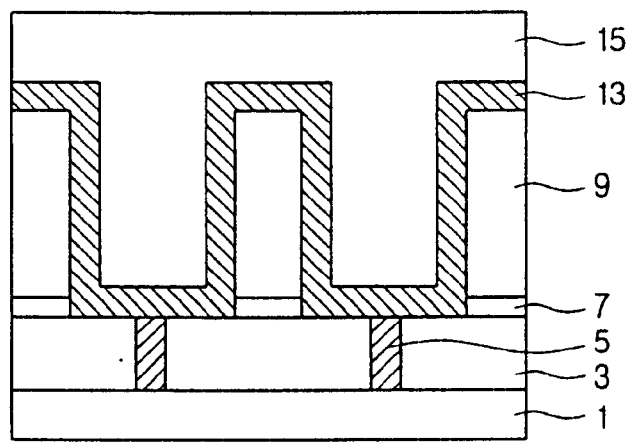
Figure 4:
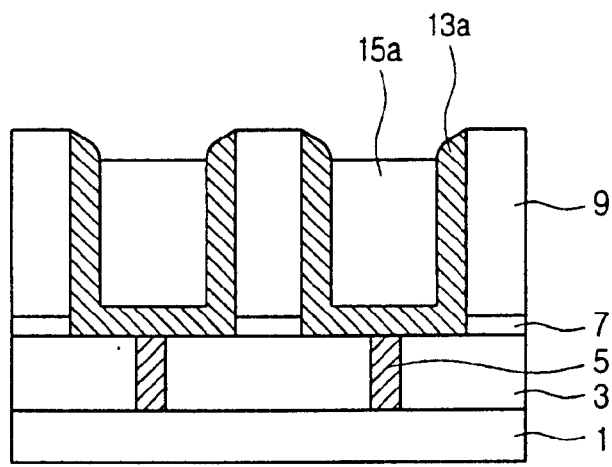
Figure 5:
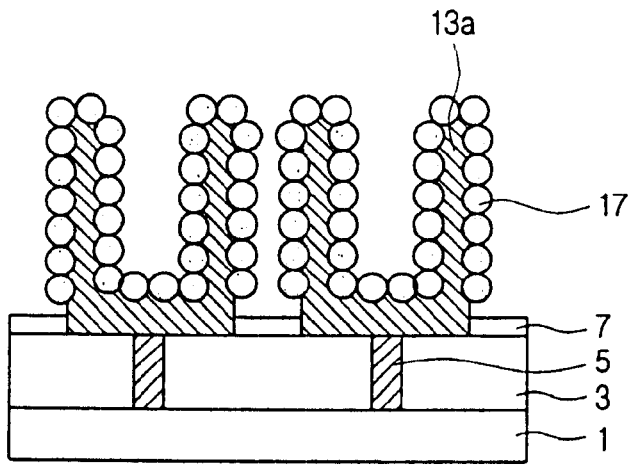
Figure 6:
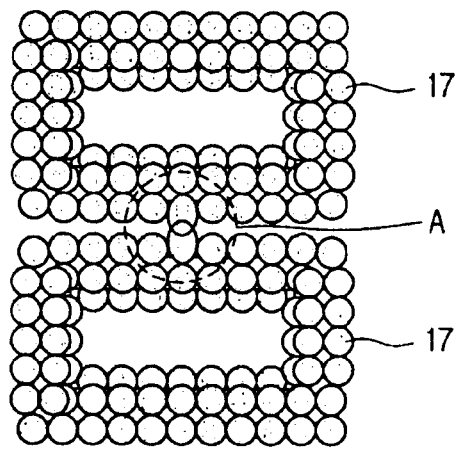
FIGS. 6 and 7 show generation of a bridge between charge storage electrodes in the conventional method for fabricating the capacitor of the semiconductor device.
Figure 7:
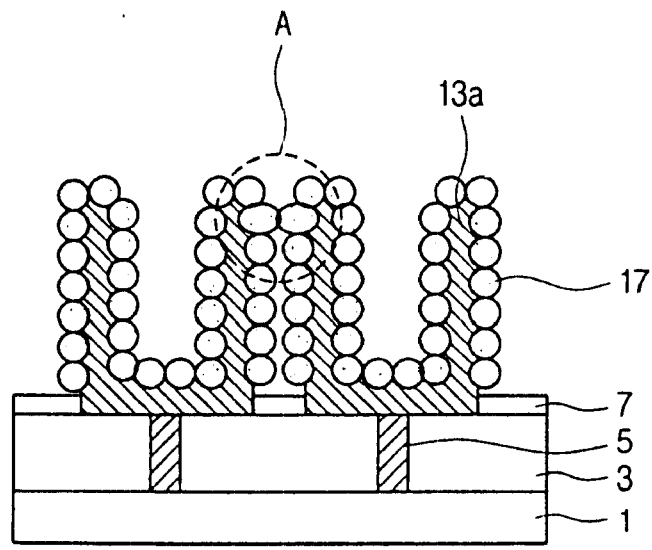
Figure 8:
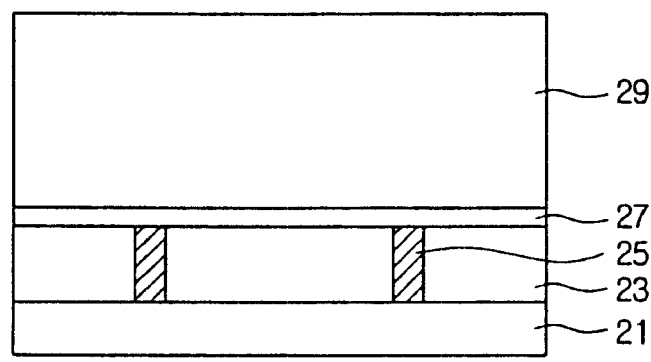
FIGS. 8 through 14 are cross-sectional views illustrating process steps of a method for fabricating a capacitor of a semiconductor device in accordance with an embodiment of the present invention.

As illustrated in FIG. 8, an interlayer insulating film 23 is formed on a semiconductor substrate 21. A photoresist film pattern (not shown) exposing a presumed storage node contact region is formed on the interlayer insulating film 23.

The interlayer insulating film 23 is selectively removed by using the photoresist film pattern as a mask, to form first contact holes (not shown) exposing portions of the semiconductor substrate 21.

Thereafter, the photoresist film pattern is completely removed, and a first polysilicon layer is formed on the interlayer insulating film 23 including the first contact holes. The first polysilicon layer is selectively removed to remain merely in the first contact holes, thereby forming contact plugs 25 functioning as lower electrode contacts.

Then, a nitride film 27 functioning as an etch barrier film is formed over the resultant structure, and an oxide film 29 is formed on the nitride film 27. Here, the oxide film 29 is used as an interlayer insulating film. Other insulating materials may replace the oxide film.

Figure 9:
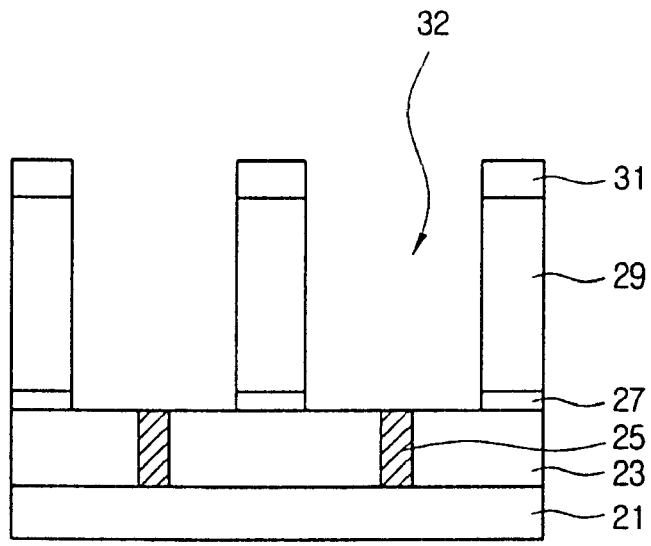

Referring to FIG. 9, a photoresist film (not shown) is then coated on the oxide film 29, and selectively patterned according to exposure and development processes of a photolithography process or other techniques, thereby forming a photoresist film pattern 31 corresponding to a lower electrode pattern for forming a capacitor.

The oxide film 29 and the nitride film 27 are then selectively removed with known processes by using the photoresist film pattern 31 as a mask, to form second contact holes 32 exposing portions of the interlayer insulating film 23 including the contact plugs 25. That is, the second holes 32 are defined through the nitride film 27, the oxide film 29 and the photoresist film pattern 31. Here, the second contact holes 32 have the same width as the width of the lower electrode region.

Figure 10:
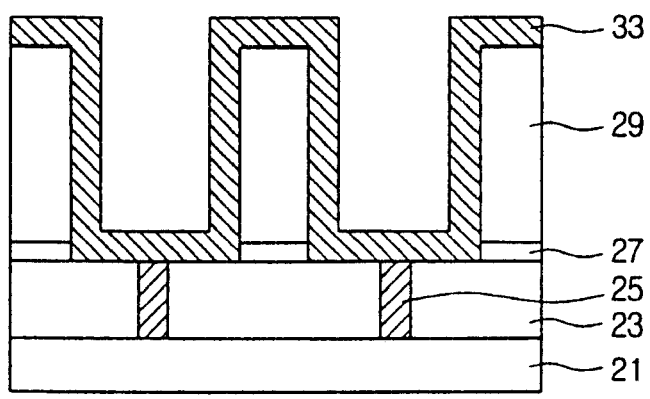

As depicted in FIG. 10, the photoresist film pattern 31 is then removed completely, and a second polysilicon layer 33 is deposited on the oxide film 29 including the second contact holes 32 using known techniques.

Figure 11:
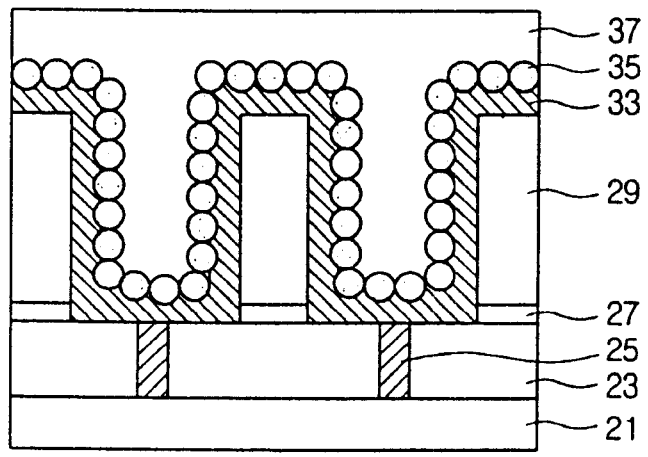

As shown in FIG. 11, a first HSG structure 35 is then formed on the second polysilicon layer 33, and an SOG film (sacrificial film) 37 is coated over the first HSG structure 35 and in the second contact hole areas. Here, the first HSG structure 35 is formed in a grain size suitable for a desired capacitance of the capacitor. A photoresist material or insulating material may replace the SOG film 37.

Figure 12:
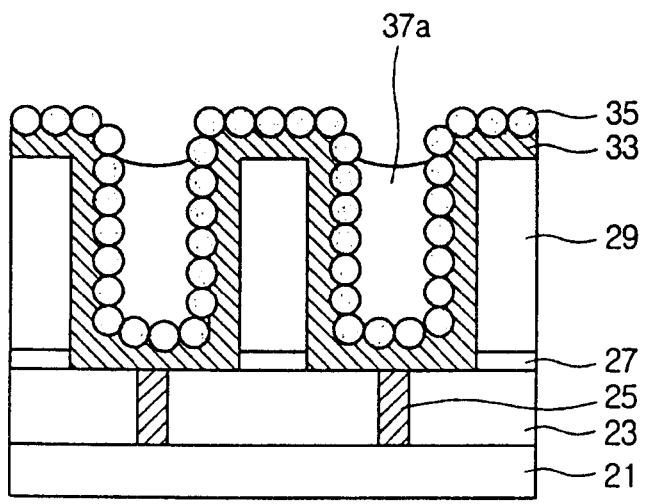

Referring to FIG. 12, the SOG film 37 is then selectively removed according to an etch back process or other processes until the top surface portions of the first HSG structure 35 are exposed. As a result, a residual SOG film 37a remains in portions of the second contact hole areas. The top surface of the residual SOG film 37a is aligned or substantially aligned with the top surface of the oxide film 29.

Figure 13:
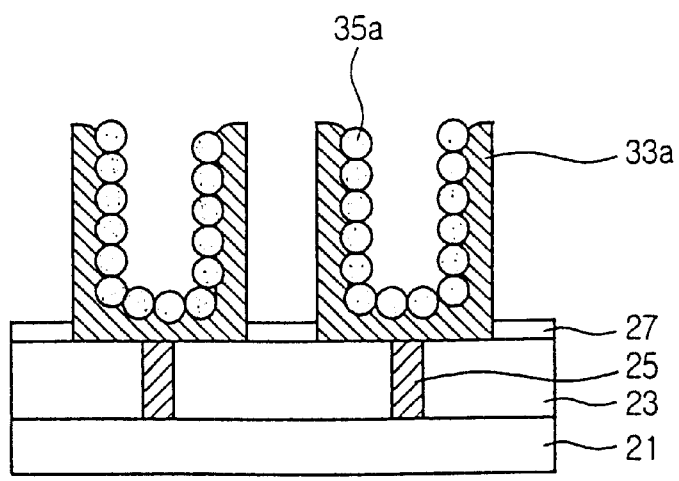

As illustrated in FIG. 13, the second polysilicon layer 33 and the first HSG structure 35 are selectively removed by using the residual SOG film 37a as a mask, until the top surface of the oxide film 29 is exposed. This produces a second polysilicon layer pattern 33a. Then the residual SOG film 37a and the oxide film 29 are completely removed. At this time, the second polysilicon layer pattern 33a remains merely in the second contact hole 32. One skilled in the art will readily appreciate that the residual SOG film 37a and the oxide film 29 can be removed either simultaneously or sequentially in any order using processes such as a dry process, a wet process, etc.

Figure 14:
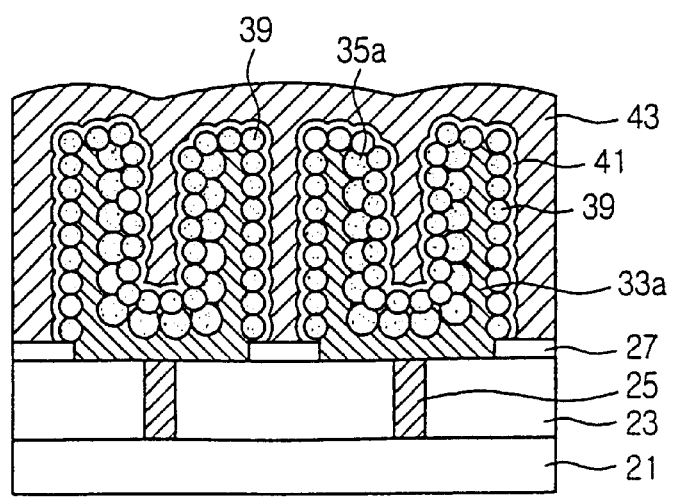

As shown in FIG. 14, a second HSG structure 39 is then formed on the exposed surfaces of the second polysilicon layer pattern 33a and the first HSG structure 35 according to a second HSG process, thereby completing the formation of a profile of the lower electrode of the capacitor. For example, each of the first and second HSG process may involve forming a poly layer pattern on the second polysilicon layer 33a and annealing the poly layer pattern to produce the first or second HSG structure 35a or 39. The grain size of the second HSG structure 39 is smaller than the grain size of the first HSG structure 35A since the second HSG structure 39 is formed on the first HSG structure 35.

Then, a dielectric film 41 is formed over the resultant structure including the second HSG structure 39 according to known techniques. A conductive material layer is also formed on the dielectric film, and selectively patterned to form an upper electrode 43 of the capacitor. This completes the method for fabricating the capacitor according to the present invention.

In accordance with the embodiments of the present invention, the method for fabricating the capacitor of the semiconductor device has many advantages including the following:

In order to form a complete HSG structure, the first HSG structure is formed on the inner surface of the second polysilicon layer, and the second HSG structure is formed on the first HSG structure and the outer surface of the second polysilicon layer. Accordingly, the second HSG structure formed on the outer surface of the second polysilicon layer composing the lower electrode has smaller grains than the first HSG structure formed on the inner surface of the second polysilicon layer. As a result, a gap between adjacent lower electrodes is enlarged significantly so as to prevent the bridge problems of conventional art.

Moreover, two HSG structures are formed on the inner surface of the second polysilicon layer. This improves the capacitance of the capacitor and allows easy adjustment of the capacitance of the capacitor by controlling the grain size of the HSG structures. This improves a refresh property and other characteristics of the device.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for fabricating a capacitor of a semiconductor device, comprising the steps of:
   providing a semiconductor substrate;
   forming a connected double-U shaped polysilicon layer pattern on the semiconductor substrate;
   forming a first HSG structure on only inside and upper surfaces of said polysilicon layer pattern;
   forming a second HSG structure on the first HSG structure and an outer surface of the polysilicon layer pattern to produce a lower electrode of the capacitor;
   forming a dielectric film on the second HSG structure; and
   forming an upper electrode on the dielectric film.

2. The method according to claim 1, wherein the lower electrode is a cylindrical type lower electrode.

3. The method according to claim 2, wherein the steps of forming the polysilicon layer pattern and the first HSG structure comprise the steps of:
   forming an insulating film having a contact hole on the semiconductor substrate;
   sequentially forming a polysilicon layer and a first HSG structure layer on the insulating film including the contact hole;
   forming a sacrificial film over the polysilicon layer and the first HSG structure layer; and
   selectively patterning the sacrificial film, the polysilicon layer and the first HSG structure layer until an upper surface of the insulating film is exposed to form the polysilicon layer pattern and the first HSG structure.

4. The method according to claim 3, wherein the sacrificial film is an SOG film or photoresist layer.

5. The method according to claim 3, further comprising the steps of:
   removing completely the sacrificial film and the insulating film.

6. The method according to claim 5, wherein, in the step of removing the sacrificial film and the insulating film, the sacrificial film is removed first, and then the insulating film is removed.

7. The method according to claim 5, wherein, in the step of removing the sacrificial film and the insulating film, the sacrificial film and the insulating film are removed at the same time.

8. The method according to claim 5, wherein the sacrificial film and the insulating film are removed by a dry process or a wet process.

9. The method according to claim 3, wherein the insulating film is an oxide film or insulating material.

10. The method according to claim 1, wherein a grain size of the second HSG structure is smaller than a grain size of the first HSG structure.

11. A method for fabricating a capacitor of a semiconductor device, comprising the steps of:
   providing a semiconductor substrate;
   forming an insulating film having a contact hole on the semiconductor substrate;
   forming a connected double-U shaped polysilicon layer and a first HSG structure on the insulating film having the contact hole, said first HSG structure being formed on only the inside and upper surfaces of said polysilicon layer;
   selectively patterning the polysilicon layer and the first HSG structure until a top surface of the insulating film is exposed to form a cylinder type lower electrode of the capacitor;
   removing the insulating film;
   forming a second HSG structure on the first HSG structure and the polysilicon layer;
   forming a dielectric film over the second HSG structure; and
   forming an upper electrode over the dielectric film.

12. The method according to claim 11, further comprising the steps of:
   forming a sacrificial film over the first HSG structure; and
   patterning the sacrificial film to produce a sacrificial film pattern.

13. The method according to claim 12, wherein the step of patterning the polysilicon layer and the first HSG structure is performed using the sacrificial film pattern as a mask.

14. The method according to claim 12, wherein the sacrificial film is an SOG film or photoresist layer.

15. The method according to claim 12, further comprising the step of:

removing completely the sacrificial film pattern and the insulating film.

16. The method according to claim 15, wherein, in the step of removing the sacrificial film pattern and the insulating film, the sacrificial film pattern is removed first, and then the insulating film is removed.

17. The method according to claim 15, wherein, in the step of removing the sacrificial film pattern and the insulating film, the sacrificial film pattern and the insulating film are removed at the same time.

18. The method according to claim 15, wherein the sacrificial film pattern and the insulating film are removed according to a dry or wet process.

19. The method according to claim 11, wherein a grain size of the second HSG structure is smaller than a grain size of the first HSG structure.

20. A method for fabricating a capacitor of a semiconductor device, comprising the steps of:

providing a semiconductor substrate;

forming a first interlayer insulating film on the semiconductor substrate;

forming a first contact hole by selectively patterning the first interlayer insulating film;

forming a contact plug in the first contact hole to be electrically in contact with the semiconductor substrate;

forming a second interlayer insulating film on the first interlayer insulating film including the contact plug;

selectively patterning the second interlayer insulating film to form a second contact hole to expose a lower electrode region of the first interlayer insulating film including the contact plug;

forming a connected double-U shaped polysilicon layer on the exposed surface of the second interlayer insulating film including the second contact hole;

forming a first HSG structure on only inside and upper surfaces of said polysilicon layer;

selectively removing the sacrificial film to form a sacrificial film on the first HSG structure;

selectively removing exposed portions of the first HSG structure and the polysilicon layer using the sacrificial film as a mask;

removing the sacrificial film and the second interlayer insulating film;

forming a second HSG structure on the first HSG structure and an exposed surface of the polysilicon layer; and forming a dielectric film and an upper electrode over the resultant structure.

* * * * *